United States Patent [19]
Kosmala

[11] Patent Number: 5,460,543
[45] Date of Patent: Oct. 24, 1995

[54] BOARDLOCK ASSEMBLY

[75] Inventor: Michael L. Kosmala, Aliso Viejo, Calif.

[73] Assignee: ITT Corporation, New York, N.Y.

[21] Appl. No.: 304,733

[22] Filed: Sep. 12, 1994

[51] Int. Cl.⁶ ................................................. H01R 13/73
[52] U.S. Cl. ............................................................ 439/567
[58] Field of Search ........................................ 439/567, 571

[56] References Cited

U.S. PATENT DOCUMENTS

| | | | |
|---|---|---|---|
| D. 291,055 | 7/1987 | Fukuhara et al. | D8/354 |
| D. 291,278 | 8/1987 | Hill | D8/354 |
| 2,936,015 | 5/1960 | Rapata . | |
| 3,031,635 | 4/1962 | Gluck . | |
| 3,500,288 | 3/1970 | Startin et al. . | |
| 4,200,900 | 4/1980 | McGeorge . | |
| 4,297,769 | 11/1981 | Coules | 174/138 |
| 4,406,511 | 9/1983 | Hayes . | |
| 4,824,398 | 4/1989 | Taylor | 439/557 |
| 4,842,552 | 6/1989 | Frantz | 439/557 |
| 4,865,555 | 9/1989 | Assini et al. | 439/82 |
| 4,907,987 | 3/1990 | Douty et al. | 439/571 |
| 4,909,746 | 3/1990 | Scholz | 439/82 |
| 4,911,659 | 3/1990 | Viselli | 439/570 |
| 4,938,703 | 7/1990 | Nakano | 439/74 |
| 5,008,777 | 4/1991 | Burns | 174/138 G |
| 5,037,327 | 8/1991 | Van Woengel | 439/571 |
| 5,108,308 | 4/1992 | Northcraft et al. | 439/555 |
| 5,108,314 | 4/1992 | Takano et al. | 439/621 |
| 5,137,454 | 8/1992 | Baechtle | 439/62 |
| 5,147,220 | 9/1992 | Lybrand | 439/567 |
| 5,154,634 | 10/1992 | Brown et al. | 439/553 |
| 5,163,851 | 11/1992 | Hart et al. | 439/567 |
| 5,178,557 | 1/1993 | Hashiguchi | 439/357 |
| 5,228,870 | 7/1993 | Gorenc et al. | 439/567 |
| 5,281,149 | 1/1994 | Petri | 439/66 |
| 5,281,166 | 1/1994 | Yu et al. | 439/571 |

FOREIGN PATENT DOCUMENTS 388478 3/1989 European Pat. Off. .
WO93/18560 3/1992 WIPO .

Primary Examiner—Gary F. Paumen
Attorney, Agent, or Firm—Freilich Hornbaker Rosen

[57] ABSTRACT

A standoff boardlock is provided for mounting a connector shell flange to a circuit board, which provides large holding power throughout a range of board hole sizes, which can be constructed at low cost, and which is versatile. The boardlock (14, FIG. 2) includes a standoff (50) formed of solid metal stock that has been lathe-machined to form primarily circular surfaces, and a clip (52) that is formed of sheet metal and that has an upper mount region (54) mounted within a hole (90) of the standoff and which has plurality of resilient beams (56) that project downwardly from the mount region and which pass through a circuit board hole (20) to lock therein. The standoff is attached to the connector shell flange (26) and to the clip in a single swaging operation wherein an upper flange (76) of the standoff is deformed radially outwardly onto the top of the shell flange and a middle flange (100) of the standoff is deformed radially inwardly into the mount region of the clip.

11 Claims, 3 Drawing Sheets

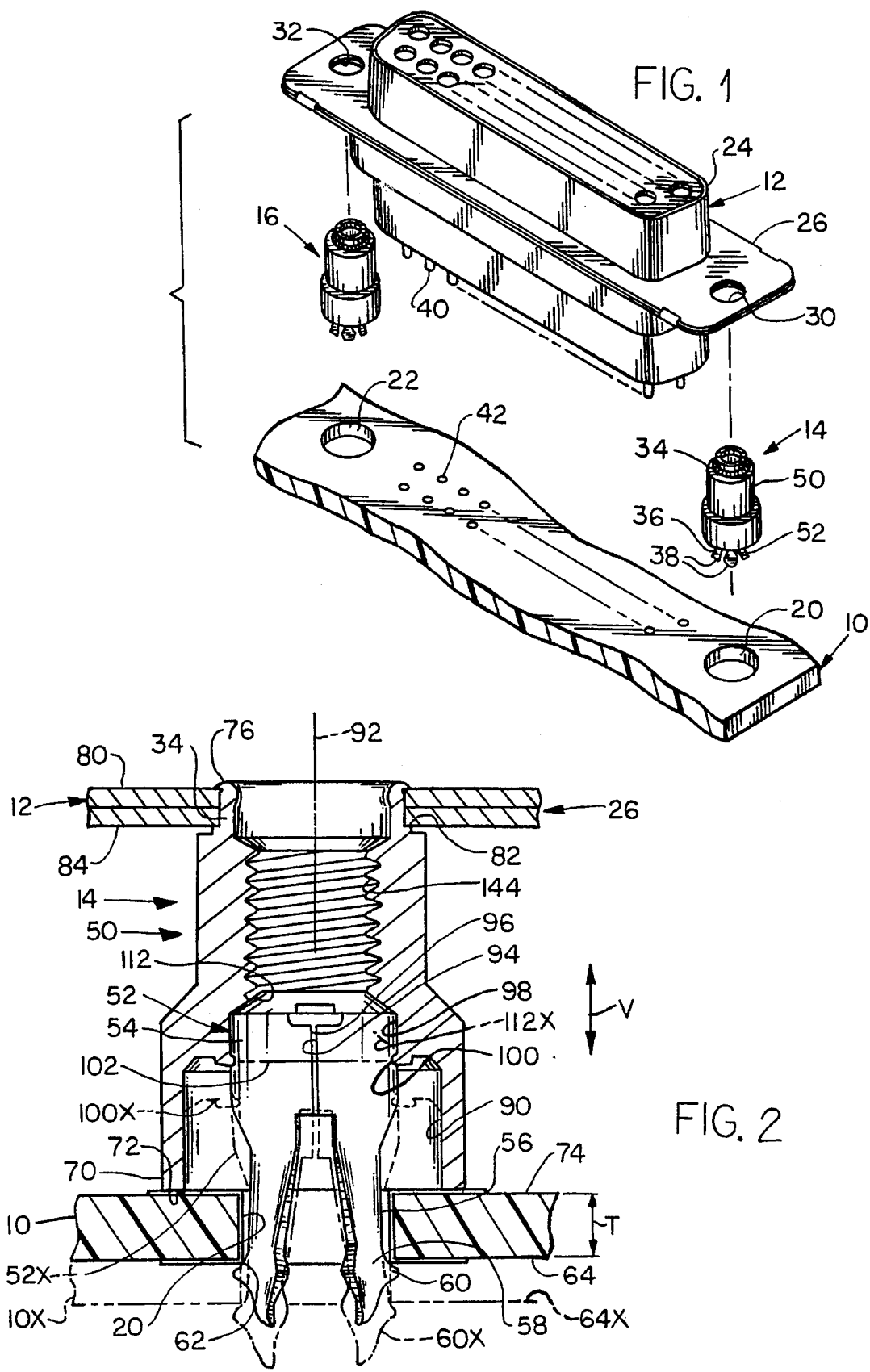

BOARDLOCK ASSEMBLY

BACKGROUND OF THE INVENTION

A standoff boardlock is often used to hold a flange of a connector shell at a predetermined distance above a circuit board, with the boardlock locking to the circuit board. Standoff boardlocks usually have a shoulder that abuts the upper face of the circuit board and a plurality of beams which pass through a hole in the circuit board and press against the lower end of the hole walls to resist upward movement out of the board. Although sheet metal clips are commonly used to hold a connector that lies flush against the circuit board, standoff boardlocks require a standoff portion that firmly supports the shell flange a distance above the circuit board, which generally requires a machined metal part. Such machined metal parts include primarily circular surfaces that can be formed at low cost on a lathe, but also include non circular surfaces to form flexible beams at the bottom to engage the circuit board. The forming of such beams in an otherwise lathe-machine part adds a substantial cost to the manufacture of the standoff boardlock. The resulting beams are not highly flexible and do not hold as well to boards of somewhat different sizes, as compared to sheet metal clips. A standoff boardlock which could be manufactured at low cost, which could securely hold themselves to circuit board holes of a range of diameters, and which facilitated boardlock use for circuit boards of different thicknesses, as well as the use of screw-and-nut holding of a connector to a circuit board, would be of value.

SUMMARY OF THE INVENTION

In accordance with one embodiment of the present invention, a standoff boardlock and a method for its assembly are provided which results in a low cost and versatile boardlock. The boardlock includes a clip with a mount region and with a plurality of retention beams depending from the mount region for insertion in a circuit board hole to press against the walls of the board hole. The boardlock also includes a standoff which has a lower end with a shoulder for lying against the circuit board, an upper end for mounting on a connector, and walls forming a vertically-extending hole that receives the clip mount portion. The walls of the standoff hole hold the clip mount portion a predetermined distance above the standoff shoulder, to fix the height of the lower portions of the retention beams. The standoff is a lathe-machined part with primarily circular surfaces, while the clip is a deformed piece of sheet metal. The standoff can be fixed to the clip and to a flange of the connector, by deforming top and middle flanges in a single swage operation.

The novel features of the invention are set forth with particularity in the appended claims. The invention will be best understood from the following description when read in conjunction with the accompanying drawings.

BRIEF DESCRIPTION OF THE DRAWINGS

FIG. 1 is an exploded isometric view of a combination of the present invention, which includes a connector, a circuit board, and two standoff boardlocks.

FIG. 2 is a partial sectional side view of the combination of FIG. 1, shown fully assembled.

DESCRIPTION OF THE PREFERRED EMBODIMENT

Figure 3:
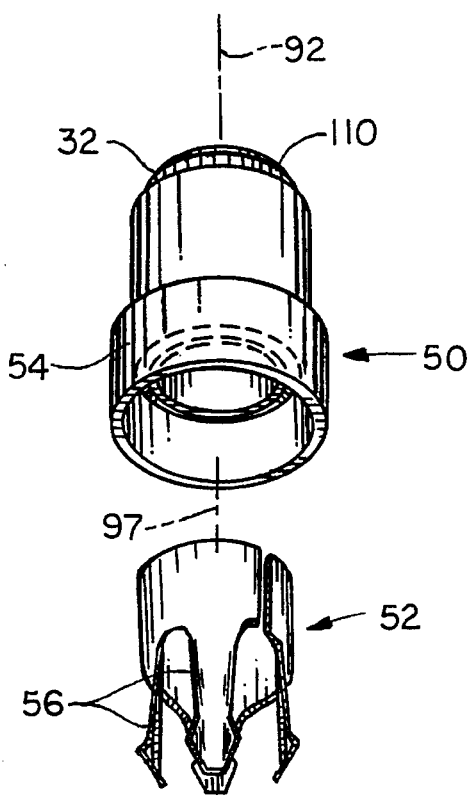
FIG. 3 is an exploded bottom isometric view of the standoff and clip of the boardlock of FIG. 2.

FIG. 1 illustrates a combination of a circuit board 10, a connector 12 and two standoff boardlocks 14, 16. The circuit board has a pair of board holes 20, 22, while the connector has a shell 24 with a shell flange 26 that has a pair of shell holes 30, 32. Each boardlock has an upper end 34 that can mount to the shell flange at one of the shell holes. Each boardlock also has a lower end 36 that includes a plurality of deflectable retention beams 38 for insertion in a board hole 20 to press against the walls of the hole and hold the boardlock and therefore the connector to the circuit board. The connector has multiple contacts with tail ends 40 that are received in plated apertures 42 of the board to connect to metal traces (not shown) on the board.

The boardlock 14 includes a standoff 50 and a separate clip 52. As shown in FIG. 2, the clip 52 has a mount region 54 and has a plurality of retention beams 56 depending from the mount region and having lower beam portions 58 that lock to the circuit board. The particular clip shown has four retention beams, each one having an outwardly-bent edge part 60 that bears against the bottom or lower edge 62 of the circuit board hole wall, where it intersects the bottom or lower surface 64 of the circuit board. It may be noted that this general construction of the clip is shown in my U.S. Pat. No. 5,401,188 issued Mar. 28, 1995.

The standoff has a lower end 70 with a downwardly-facing shoulder 72 that abuts an upper face 74 of the circuit board. The upper end 34 of the standoff has a top flange 76 that abuts an upper surface 80 of the shell flange 26, and has an upper shoulder portion 82 that abuts a lower surface 84 of the shell flange, to fix the standoff to the flange. The distance between the upper shoulder portion 82 and the downwardly-facing lower shoulder 72 at the lower end 70 of the standoff, fixes the distance at which the connector flange is held above the circuit board.

The standoff has a standoff hole 90 that extends along a vertical standoff axis 92. The hole is of a size to closely receive the mount region 54 of the clip at the illustrated mount region position. The clip is formed of sheet metal and its mount region is of substantially cylindrical tubular shape with adjacent edge portions 94, 96. The clip has a vertical axis 97 that will lie coincident with the standoff axis in the final assembly. Applicant prefers that the edge portions 94, 96 lie very close together when the clip mount region 54 has been resiliently squeezed to fit within a hole portion 98 of the standoff hole 90. The clip is fixed in place by a middle flange 100 of the standoff, which extends radially inwardly (with respect to the axis 92) into the mount region 54. The middle flange 100 permanently deforms a ring-shaped portion 102 of the mount region inwardly, to fix the standoff to the clip.

Figure 4:
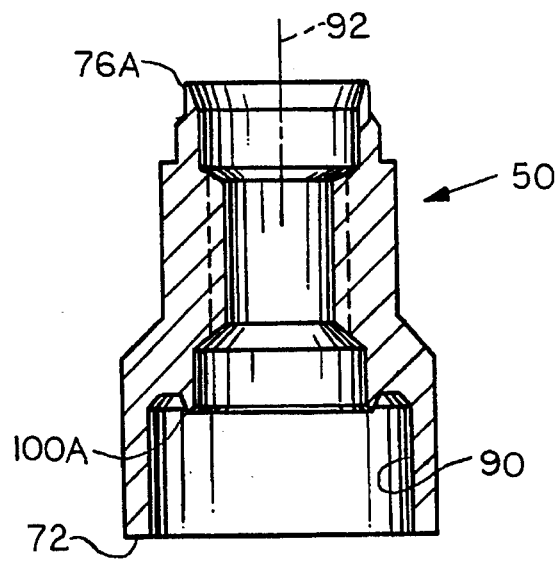
FIG. 4 is a sectional side view of the standoff of FIG. 2, shown prior to assembly of it to the clip.

As shown in FIGS. 3 and 4, the standoff 50 is a part that is formed of a solid piece of metal stock (e.g., a rod) that has been machined on a lathe. As a result, substantially all of its surfaces are circular and centered on the standoff axis 92. An exception is a ring of teeth 110 formed at the upper end of the boardlock by the single stroke of a forming tool (which can be used while the standoff is mounted on a lathe) into a lathe-machined region. Another exception is a helical (almost circular) thread. The clip 52 is formed of a piece of sheet metal which has been blanked from a larger sheet, and which has been bent by stamping dies. The lathe-machined standoff 50 is desirable to provide rigidity for positioning the shell flange above the circuit board. Set up costs for machining the standoff are relatively low (e.g., a few hundred dollars), and the parts can be manufactured at low cost if they are primarily machined on a lathe. In the prior art, a machined boardlock had a depending portion in which a precision cross slot had to be formed to create deflectable beams, and such precision cross slot added significantly to the cost. Also, such machined beams had limited flexibility because they had to be thick (e.g., 0.75 mm maximum thickness for beams of a length of 4 mm) due to difficulty in machining thin sections of parts.

The stamping dies for the clip 52 have a considerable cost (e.g., several tens of thousands of dollars). However, once the clip dies have been constructed, a large number of identical clips can be produced at low cost. Because of the fact that the clips are formed of sheet metal (e.g., of a thickness of 0.25 mm), the retention beams can be thin (0.25 mm for beams at a length of 4 mm) and therefore have large flexibility. The large flexibility is desirable to enable the beams to firmly hold to circuit board holes of a range of sizes such as 0.115 inch to 0.130 inch, which encompasses world-wide industry standard hole sizes in countries that includes the United States, Europe and Japan. By applicant's use of a lathe-machined standoff and a separate bent sheet metal clip, applicant is able to obtain the high rigidity required for the standoff function and the high flexibility desirable for circuit board retention.

The thickness T (FIG. 2) of circuit boards commonly varies between 0.054 inch and 0.135 inch. Applicant can construct a standoff boardlock for a thicker circuit board whose lower surface is at 64X (FIG. 2) by the use of the same clip or clip device 52, but with a second standoff or standoff device 52X that is slightly modified. The second standoff device 52X is modified by positioning the middle flange at 100X so it lies closer (in the vertical direction V) to the downwardly-facing shoulder 72 on the standoff. The rest of the standoff is substantially identical to the standoff 50. The middle flange at 100X holds the clip at 52X lower, so its beam lower edge parts at 60X can engage the lower surface 64X of the thicker circuit board 10X. Since the standoff is a lathe-machined part, the setup for machining a different part is relatively low, especially because all of the dimensions are identical except for the height of the flange 100X (plus the height of a middle shoulder 112X).

Figure 5:
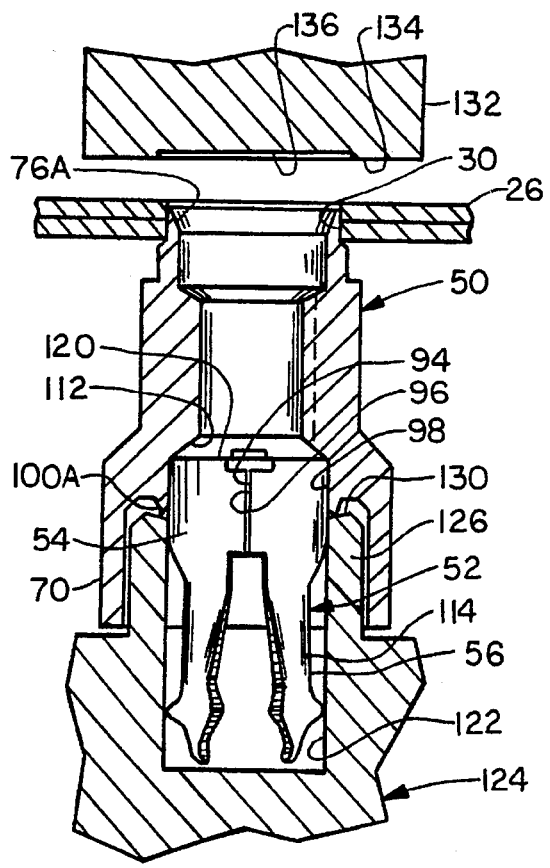
FIG. 5 is a sectional side view of the standoff and clip of FIG. 2, showing one step during their assembly and showing portions of dies used in the assembly.
Figure 6:
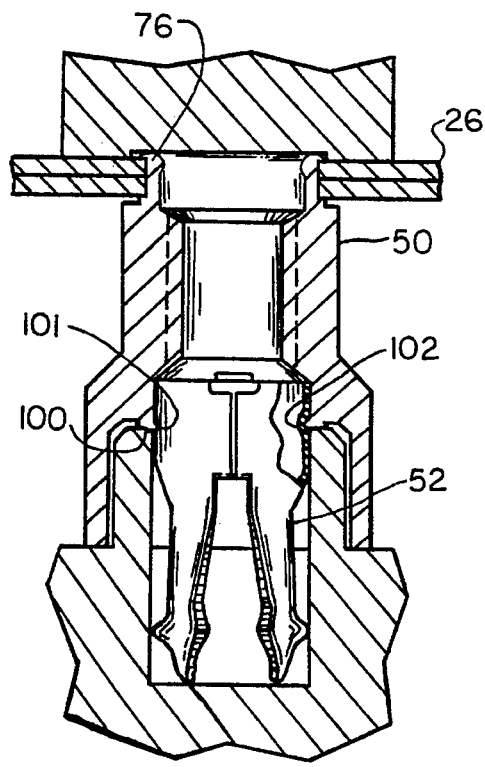
FIG. 6 is a view similar to that of FIG. 5, but showing the standoff and clip after their assembly and showing the dies in position at the completion of the assembly.

FIGS. 5 and 6 illustrate steps employed by applicant to assemble the standoff 50 to the clip 52 and to the connector shell flange 26. First, applicant places the retention portion 114 of the clip, which includes the beams 56 into a hole 122 of a lower swaging die 124. Then, the standoff 50 is placed so its lower end 70 receives an upper die portion 126 of the lower die. The clip will be already compressed so its mount portion 54 can enter the hole portion 98 of the standoff 50 until an upper edge 120 of the clip abuts the tapered middle shoulder 112 of the standoff hole walls. The mount region of the clip will be compressed so the edges 94, 96 will lie close together. The upper die portion 126 has an upper surface 130 that rests on the undeformed middle flange 100A of the standoff. The connector shell flange 26 is positioned so its holes such as hole 30 receive the undeformed upper flange 76A. Then, an upper swaging die 132 is moved downwardly so a surface 134 of the die presses down against the shell flange 26 and a recessed wall 136 of the die presses down against the upper flange 76A of the standoff and deforms the upper flange 76A radially outwardly. At the same time, the downwardly moving upper die 132 moves down the entire standoff 50 which causes the middle flange 100A to be deformed radially inwardly into the mount region 54 of the clip.

Figure 4A:
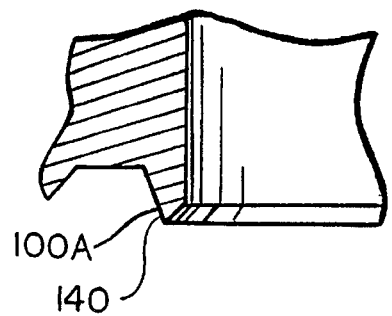
FIG. 4A is an enlarged view of a portion of the standoff of FIG. 4.

FIG. 6 shows the standoff 50 and clip 52 after the swaging or deforming operation, wherein the upper flange 76 has been deformed radially outwardly while the middle flange 100 has been deformed radially inwardly so a portion 101 thereof extends into the clip mount portion. The standoff protects much of the clip. FIG. 4A shows that the middle flange 100A is formed with a tapered surface 140 which encourage radially inward deflection of the flange 100A. The top flange is constructed in a corresponding manner for radially outward deflection.

The fact that the standoff can be attached to the clip in the same operation in which the standoff is attached to the shell flange, significantly lowers the cost for the assembly of the boardlock and connector. Although some savings in dies are achieved, the main savings are due to the fact that the standoff, clip and connector flange have to be handled only once to assemble them.

It may be noted in FIG. 2, that applicant prefers to form the standoff hole 90 so that it extends vertically completely through the height of the standoff. Also, applicant prefers to form an internal thread 144 above of the middle shoulder 112. The thread 144 is useful to receive a screw that holds the connector shell flange 26 to the flange of a mating connector.

Figure 7:
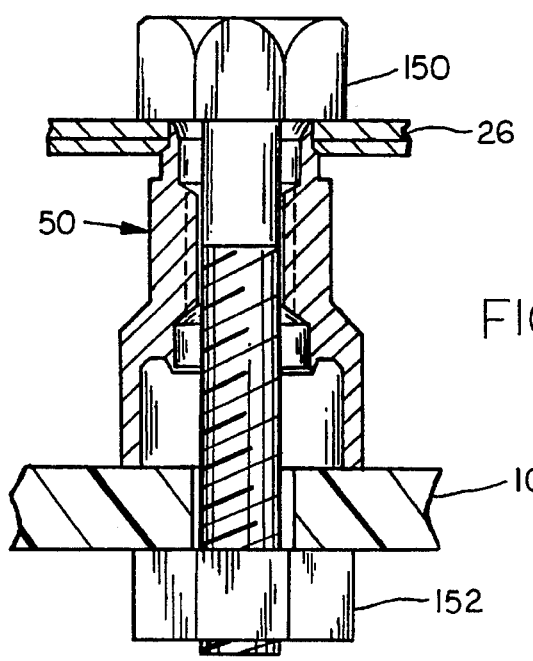
FIG. 7 is a sectional side view showing the standoff of FIG. 4 in another fastening arrangement.

FIG. 7 shows that the standoff 50 is useful not only in retention beam mounting of a connector to a circuit board, but also in the use of a screw 150 and nut 152 to hold a connector shell flange 26 to a circuit board 10.

While applicant has used terms such as "vertical", "upper", etc. to help in the description of the invention as illustrated, it should be understood that the boardlock can be used in any orientation with respect to Earth's gravity.

Thus, the invention provides a standoff boardlock, or boardlock assembly as well as an assembly method therefor, which is of low cost, provides reliable holding for circuit boards with large hole tolerances, and is versatile. The boardlock includes a standoff and a separate clip, which are assembled to form the complete boardlock. While the standoff is machined from solid metal stock, and is preferably lathe-machined to form primarily circular surfaces centered on the standoff axis, the clip is formed by bending a piece of sheet metal. The standoff and clip are constructed for economical assembly to each other and to a connector flange, by forming the standoff with a middle flange that closely surrounds a mount region of the clip and with a top flange that is closely received a shell flange hole. A single swaging step deforms the middle flange radially inwardly and deforms the top flange radially outwardly to lock the standoff to both the clip and the shell flange.

Although particular embodiments of the invention have been described and illustrated herein, it is recognized that modifications and variations may readily occur to those skilled in the art, and consequently, it is intended that the claims be interpreted to cover such modifications and equivalents.

I claim:

1. A boardlock for mounting a connector on a circuit board that has a hole, comprising;

a clip which has a mount region and a plurality of retention beams depending from said mount region and having lower beam portions for locking to said circuit board hole;

a standoff which has a lower end with a shoulder for abutting said circuit board, an upper end for mounting on said connector, and hole walls forming a vertically extending standoff hole of a size to receive said mount region to hold said mount region a predetermined distance above said shoulder to fix the height of said lower beam portions below said shoulder; said clip is formed of bent sheet metal, while said standoff is a part that has been lathe-machined from solid metal stock and that has primarily circular machined surfaces.

2. The boardlock described in claim 1 wherein:

said standoff has a vertical axis and said mount region lies in said hole;

said walls of said hole in said standoff include a middle flange which has a deformed portion that extends radially inwardly into said mount region, with said mount region being substantially cylindrical and extending above and below said middle flange but being inwardly deformed at said middle flange.

3. The boardlock described in claim 2, including a second clip device and a second standoff device, said second clip device being identical to said clip, and said second standoff device being identical to said standoff with a lower end having a shoulder and with a middle flange part, except that the vertical distance between said flange part and shoulder of said second standoff device is less than the vertical distance between said flange and shoulder of said standoff, whereby a connector can be mounted on circuit boards of different thicknesses using identical clips.

4. A combination of a circuit board that has an upper face and a pair of board holes that each has hole walls, with a lower edge a connector which has a shell flange with a pair of shell holes, and a pair of boardlocks that each has an upper end mounted to said shell flange at one of said shell holes and that each has a lower end with a plurality of deflectable beams that lie in said circuit board hole and that press against the walls of said hole, characterized by:

each of said boardlocks includes a lathe-machined standoff which has an axis and primarily circular surfaces centered on said axis, said standoff having an upper end fastened to said connector flange at one of said shell holes, a lower end which forms a downwardly-facing shoulder that abuts said upper face of said circuit board, and walls forming a standoff hole extending along said axis;

each of said boardlocks includes a sheet metal clip which has a mount region that lies in said hole of one of said standoffs and which is mounted on the standoff, and which has a plurality of resilient beams that project downwardly below said shoulder of the standoff and into one of said board holes and which press against said lower edge of said hole walls of the corresponding one of said board holes.

5. The combination described in claim 4 wherein said upper end of said standoff includes a swaged top flange that is bent radically outwardly against the top of said shell flange, and wherein:

said mount region of said clip is substantially cylindrical and said standoff walls include a swaged middle flange that is bent radially inward and penetrates into said mount region of said clip, whereby to enable attachment of said standoff to said shell flange and to said clip mount region in a single double swage operation.

6. A method for constructing a boardlock and assembling it to a connector shell flange that has a shell flange hole, comprising:

forming a clip with a tubular mount region lying substantially on a vertical clip axis, and with a plurality of beams depending from said tubular mount region;

forming a standoff with a top and bottom, with a hole extending upwardly into said bottom and along a standoff vertical axis to leave a bottom shoulder, with a generally downwardly depending middle flange in said hole, and with a generally upwardly projecting flange at said top;

inserting said clip mount region into said hole of said standoff and within said middle flange, with said clip and standoff axes being substantially coincident, and inserting said top flange upwardly into said shell flange hole;

simultaneously applying largely downwardly force to said top flange to deform it radially outwardly to lock said top portion to said connection shell flange, while applying largely upward force to said middle flange to deform it radially inwardly into said tubular mount region to lock said middle flange to said clip.

7. The method described in claim 6 wherein:

said step of forming a clip includes bending a piece of sheet metal to form said tubular mount and said beams;

said step of forming a standoff includes machining a piece of metal stock on a lathe to form said boardlock with primarily circular surfaces that are centered on said standoff axis.

8. The method described in claim 7 wherein:

said standoff and clip form a boardlock, with said beams of said clip projecting below said bottom shoulder of said standoff to enter a through hole in one of a plurality of circuit boards that each has a bottom surface, and with lower portions of said beams pressing with radially outward directional components against the intersection of the board hole and board bottom surface;

said different ones of said circuit boards have different thicknesses; and including constructing a plurality of said boardlocks for installation in different ones of said circuit boards of different thicknesses, including forming a plurality of clip devices that are all identical to said clip, and forming a plurality of standoff devices that are all substantially identical to said standoff except that the separation distance between the middle flange and bottom shoulders of some of said standoff devices are different from the separation distance of said standoff.

9. A method for constructing a boardlock and assembling it to a connector that has a connector shell flange that has a shell flange hole, so the boardlock can hold the connector to a circuit board that has an upper surface and a board hole, comprising:

forming a clip with a tubular mount region that has a substantially cylindrical outside surface portion and with a plurality of beams depending from said mount region for insertion into said board hole;

forming a standoff with a downwardly-opening hole that can receive said mount region of said clip at a clip mount position, with said standoff having a lower end that forms an annular shoulder for abutting said upper surface of said circuit board, with said standoff having a downwardly projecting middle flange at said clip mount position wherein said middle flange has substantially the same inside diameter as said substantially cylindrical outside surface portion of said clip mount region; and with said standoff having a top with an upwardly projecting top flange having an outside of substantially the same diameter as said shell flange hole;

inserting said clip into said hole of said standoff until said outside surface portion of said clip mount region lies within said middle flange, and inserting said top flange into said shell flange hole;

deforming said top flange radially outwardly while deforming said middle flange radially inwardly, to lock said standoff to said connector flange and to said clip mount region.

10. A boardlock for mounting a connector on a circuit board that has a hole, comprising:

a clip which has a mount region and a plurality of retention beams depending from said mount region and having lower beam portions for locking to said circuit board hole;

a standoff which has a lower end with a shoulder for abutting said circuit board, an upper end for mounting on said connector, and hole walls forming a vertically extending standoff hole of a size to receive said mount portion to hold said mount portion and with a part that extends into said hole and abuts at least a portion of said clip to prevent movement of said clip, to hold said mount portion at a predetermined distance above said shoulder to fix the height of said lower beam portions below said shoulder.

11. The combination described in claim 10 wherein said standoff has a vertical axis and said standoff has an upper end with an upwardly projecting top flange that can be bent to extend radially outwardly by a downward vertical swaging force to lock to said connector and wherein:

said mount region of said clip is substantially cylindrical and said standoff walls that form said standoff hole include said part which comprises a middle flange that can be bent to extend radially inwardly by an upward vertical swaging force to penetrate into said mount region of said clip, whereby to enable attachment of said standoff to said connector arid to said clip mount region in a single vertical double swage operation.

* * * * *